(12) United States Patent
Verlinden

(10) Patent No.: US 6,459,753 B2
(45) Date of Patent: Oct. 1, 2002

(54) FRACTIONAL N-DIVIDER, AND FREQUENCY SYNTHESIZER PROVIDED WITH A FRACTIONAL N-DIVIDER

(75) Inventor: Jozef Jacobus Agnes Maria Verlinden, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/859,942

(22) Filed: May 18, 2001

(30) Foreign Application Priority Data

May 19, 2000 (EP) .......................................... 00201777

(51) Int. Cl.⁷ .............................................. H03K 21/00

(52) U.S. Cl. ............................................ 377/48; 377/47
(58) Field of Search ..................................... 377/47, 48

(56) References Cited

U.S. PATENT DOCUMENTS

| | | | | |
|---|---|---|---|---|
| 4,295,158 A | * | 10/1981 | Nissen et al. .................. | 358/17 |
| 5,218,314 A | * | 6/1993 | Efendovich et al. ........ | 328/155 |
| 5,889,436 A | | 3/1999 | Yeung et al. .................. | 331/2 |

FOREIGN PATENT DOCUMENTS

| | | | | |
|---|---|---|---|---|
| DE | 3634594 A1 | 4/1988 | ............ | H03K/3/02 |
| EP | 0648016 A1 | 4/1995 | ............ | H03K/3/03 |

OTHER PUBLICATIONS

Patent Abstracts of Japan, Hirahata Shigeru, "Horizontal Synchronism Reproducing Circuit," Publication No. 62268274, Nov. 20, 1987, Application No. 61110736, May 16, 1986.

* cited by examiner

Primary Examiner—Margaret R. Wambach
(74) Attorney, Agent, or Firm—Aaron Waxler

(57) ABSTRACT

A fractional divider divides an input frequency of a first signal (Fi) by a rational, non-integral number, which rational number is greater than one and, when written as vulgar fraction, can only be written with a denominator not equal to one. The device comprises a number of series connected delay elements (a, b, c, ..., R). Each of the delay elements (a, b, c, ..., R) adds a predetermined delay to the signal of a previous delay element (a, b, ..., R-1). The first signal (Fi) is applied to the first delay element (a). The delay added again and again per delay element equals the period of the first signal (Fi) divided by the denominator of the vulgar fraction of the rational number. A counter (2) counts pulses of the first signal (Fi), which counting takes place modulo the numerator of the rational number and in steps of the denominator of the rational number. A decoder circuit (6) decodes counting scores of the counter (2), which appear successively at an output (6a, ..., 6e) of the decoder circuit (6) in dependence on the counting score and the algorithm. The combinatory circuit (6, 7, 8, 10, 11, 12, 13) comprises means (7, 8, 10, 11, 12, 13) for combining output signals of delay elements (a, b, ..., R) determined by the algorithm with output signals of the decoder circuit (6) so as to obtain the second signal (Fo).

6 Claims, 4 Drawing Sheets

| I | II | IIa | IIb | III | IV |
|---|---|---|---|---|---|
| 0 | d1 | 6a | 1 | $1/6$ | — |
| 1 | d6 | 6f | 0 | $1\,1/6$ | $2\,1/6$ |
| 2 | d5 | 6e | 0 | $2\,2/6$ | — |
| 3 | d4 | 6d | 0 | $3\,2/6$ | $2\,1/6$ |
| 4 | d3 | 6c | 0 | $4\,3/6$ | — |
| 5 | d2 | 6b | 0 | $5\,3/6$ | $2\,1/6$ |
| 6 | d1 | 6a | 0 | $6\,4/6$ | — |
| 7 | d6 | 6f | 1 | $7\,4/6$ | |
| 8 | -- | - | - | | $2\,1/6$ |
| 9 | d5 | 6e | 1 | $8\,5/6$ | — |
| 10 | d4 | 6d | 1 | $9\,5/6$ | $2\,1/6$ |
| 11 | d3 | 6c | 1 | 11 | — |
| 12 | d2 | 6b | 1 | 12 | $2\,1/6$ |
| 0 | d1 | | | $1/6$ | — |

FIG. 3

FRACTIONAL N-DIVIDER, AND FREQUENCY SYNTHESIZER PROVIDED WITH A FRACTIONAL N-DIVIDER

The invention relates to a device for generating a second signal having a frequency equal to a frequency of a first signal divided by a rational, non-integer number, which rational number is greater than one and, when written as a vulgar fraction, can only be written with a denominator not equal to one.

Such devices are known and are widely used in frequency synthesizers with phase locked loop circuits, also referred to as PLL frequency synthesizers hereinafter.

The frequency step size in the output signal of a PLL frequency synthesizer is equal to the input frequency. The frequency resolution is greater in proportion as the step size is smaller. If a very high frequency resolution is desired, a low input frequency should be used. In practice, a low input frequency is usually accompanied by a correspondingly small bandwidth of the PLL for preventing undesirable effects such as oscillation, etc. Small bandwidths of the PLL, however, are undesirable because they lead to a slow tuning, i.e. a long tuning period, to an inadequate suppression of phase noise of the voltage-controlled oscillator, to sensitivity to hum and noise, and to major a jitter of the clock signal. In addition, such a circuit is difficult to implement in integrated circuits.

The problems outlined above can be counteracted to a major extent by means of a device according to the invention which is characterized by means for supplying the first signal to a first of a number of delay elements connected in series for the purpose of further delaying the first signal per delay element each time by a time period equal to the period time of the first signal divided by the denominator of the vulgar fraction of the rational number, and by a combinatorial circuit which comprises a counter for counting pulses of the first signal, which counting takes place modulo the numerator of the rational number and in steps of the denominator of the rational number and results in counter scores, which combinatorial circuit comprises a decoder circuit for decoding counter scores on the basis of an algorithm determined by the rational number, said decoded counter scores appearing as an output signal each time at one output, determined by the counter score and the algorithm, of the decoder circuit, and which combinatorial circuit comprises means for combining output signals of delay elements determined by the algorithm with output signals of the decoder circuit so as to obtain the second signal.

It is achieved thereby that a divisional ratio with a rational, non-integer number can be made. The jitter of the divider circuit depends only on the intrinsic jitter of the system if the number of delay elements is equal to the denominator of the rational number.

If the number of delay elements is smaller than the denominator of the rational number, the jitter imposed on the resolution is equal to the period time of the first signal divided by the number of delay elements.

A device according to the invention has a great bandwidth and a short tuning time, little noise (low jitter, little spectral pollution), high resolution, is inexpensive, and can be readily integrated into integrated circuits.

A preferred embodiment of a device according to the invention is characterized in that the delay elements are connected as a delay locked loop circuit.

A phase locked loop circuit comprising a feedback loop is characterized in that a device as discussed above is included in the feedback loop.

A known solution for tackling the problem of a small bandwidth consists in a fast switching between two divider numbers between the output of a PLL circuit and an input thereof. This is called dither. Dividing then takes place, for example, by two larger numbers lying close together, for example 4 and 5. This is the equivalent of dividing by on average 4.5. However, the second frequency may be correct then on average, but this need not be the case instantaneously, i.e. at each and every moment. It is not possible in a simple manner in circuits of this kind to divide by two numbers having a difference smaller than one. A device according to the invention as described above does make this possible.

A phase locked loop circuit according to the invention comprising a feedback loop with dither possibility is characterized in that a device as described above is included in the feedback loop.

The invention will now be explained in more detail below with reference to the accompanying drawings, in which:

FIG. 1 diagrammatically shows a phase locked loop frequency synthesizer;

FIG. 3 is a Table showing the relation between the periods of Fi, counter scores, 1-0 and 0-1 transitions, and periods between consecutive 0-1 transitions;

Figure 1:
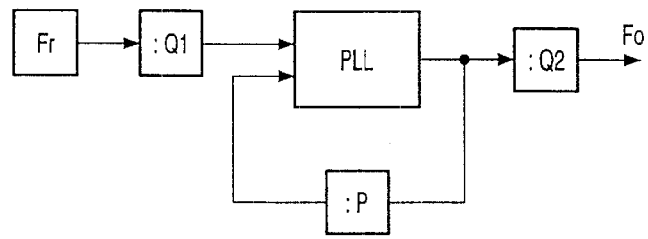
FIG. 1 shows a frequency synthesizer circuit which utilizes a phase locked loop circuit in its most extensive form. The circuit as shown is capable of realizing any rational ratios between Fo and Fr with integer numbers P, Q1, and Q2, because $Fo=(P/(Q1*Q2))*Fr$.

The frequency step size in the output signal of the phase locked loop synthesizer of FIG. 1 is equal to Fr/Q1. If a high frequency resolution is desired, the consequence is that Fr/Q1 must be small. This also means that the bandwidth of the loop formed by the phase locked loop circuit PLL and the divider P must be small. The small bandwidth of the loop, however, is undesirable because the tuning time of the circuit as a whole becomes longer in proportion as the bandwidth becomes smaller, and an insufficient suppression will take place of the phase noise of the voltage-controlled oscillator of the PLL circuit, there will be noise and hum sensitivity, and there will be a considerable jitter in the clock. In addition, this type of circuit is difficult to implement in integrated circuits.

Figure 4:
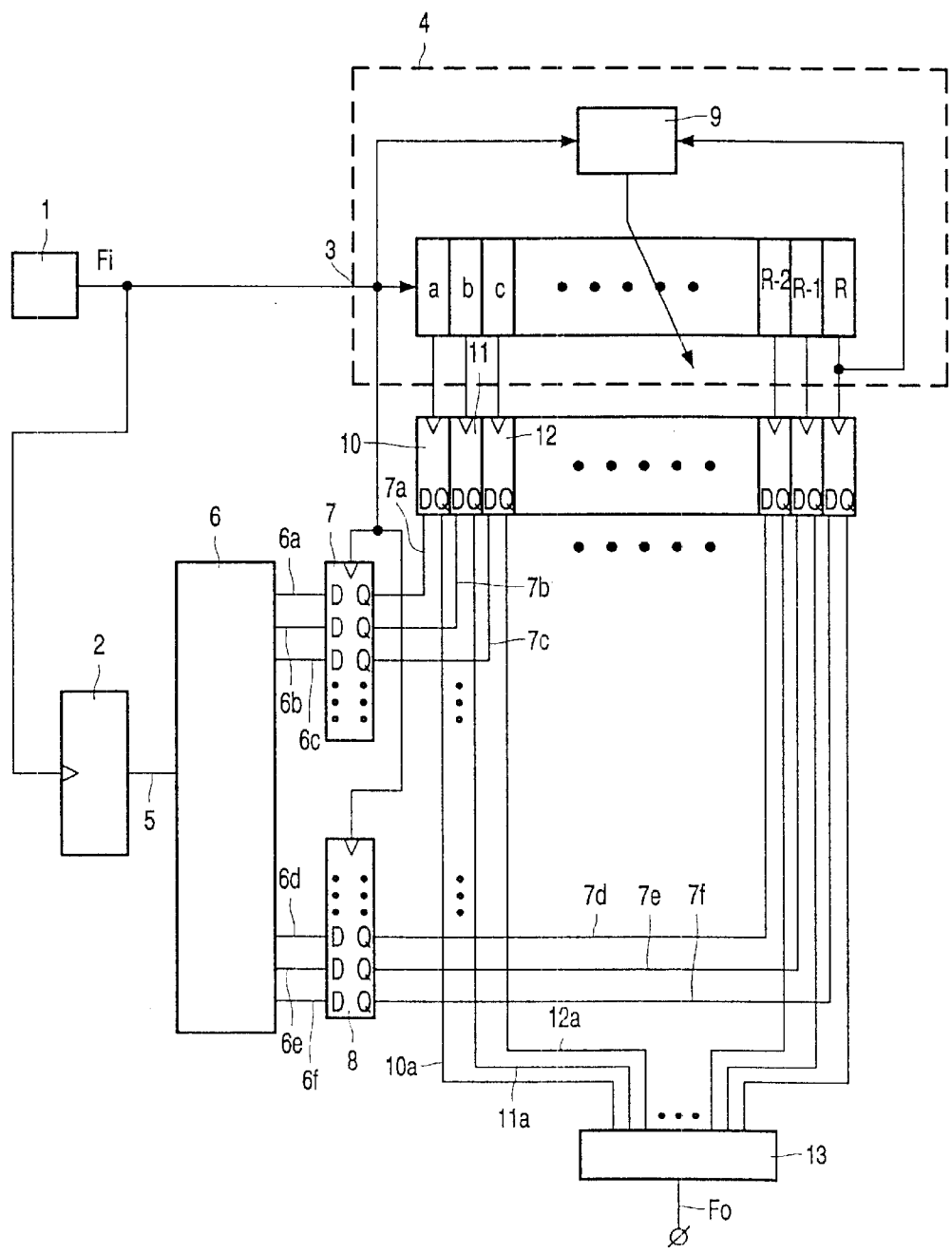
FIG. 4 is an example of a circuit by means of which the method according to FIGS. 2 and 3 can be implemented.

For a better understanding of the circuit shown in FIG. 4, an example will now first be discussed of the method to be used, wherein an output signal is generated having a frequency which is 6/13 of an input frequency Fi.

Figure 2:
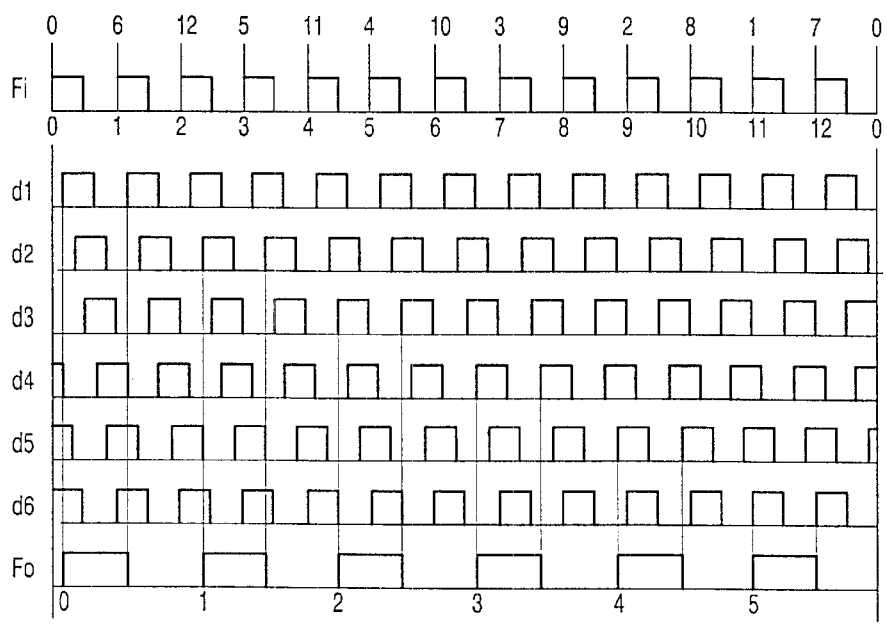
FIG. 2 shows an example of a 13/6 division of a signal Fi.

FIG. 2 shows the signal of the input frequency Fi as a function of time. Also shown are the individual periods of the input frequency Fi, which are indicated with 0, 1, 2, . . . 11, 12, 0, . . . Six different signals d1 to d6 are also indicated. d1 is the same signal as the signal Fi, but with a delay equal to 1/6 of the period of the signal Fi. Similarly, d2 is the same signal as the signal Fi, but with a delay of 2/6 of the period of the signal Fi. The signals d3, d4, d5, and d6 are also delayed signals, equal to the signals Fi, but delayed by 3/6, 4/6, 5/6, and 6/6, respectively, of the period of the signal Fi, respectively. Since the division by 13/6 is to take place, 13 periods are shown of each of said signals, and a shift of 1/6 period takes place upon each delay.

The output signal Fo is to complete exactly six periods in the time in which the input signal Fi completes exactly thirteen periods, while the rising edge and the falling edge of consecutive pulses of the signal Fo must lie at the same time distance from one another, irrespective of which two consecutive pulses of the signal Fo are considered. The number of periods of the signal Fo must also be equal to 6 in the time in which the signal Fi has 13 periods.

This is achieved as follows. The first pulse of the signal Fo referenced zero in FIG. 2 has a rising edge which coincides with the rising edge of the first pulse of the signal d1. The falling edge of the zero pulse of the output signal Fo coincides with the next rising edge of the signal d1. To obtain the rising edge of the next pulse, i.e. no. 1, of the signal Fo, a switch-over is made to the delayed signal d2. The rising edge of pulse 1 of the signal Fo coincides with the rising edge of the first pulse of the signal d2 which occurs after the third pulse, i.e. no. 2, of the signal Fi. The falling edge of the pulse 1 of the signal Fo corresponds to the rising edge of the pulse of the signal d2 which follows the fourth pulse, i.e. no. 3, of the signal Fi. Similarly, the third pulse, i.e. no. 2, of the signal Fo is achieved by means of the delayed signal d3 in combination with the fifth and sixth pulses, nos. 4 and 5, respectively, of the signal Fi.

This continues for the fourth, fifth, and sixth pulses, i.e. nos. 3, 4, 5, respectively, of the signal Fo in conjunction with the signals d4, d5, and d6. In the situation shown in FIG. 2, it should be borne in mind that the pulse no. 10 of the signal Fi is not followed by a rising or falling edge of a pulse of the signal Fo.

The situation described above may be realized by means of a counter which counts the pulses of the signal Fi, each pulse raising the counter score by six, and the counter counting modulo 13. The latter means that, the moment the counter score of the counter rises above the number 13, 13 is subtracted from the next counter score. In FIG. 2, the counter score of the counter is indicated above the signal Fi. FIG. 3 is a Table in which the counter scores of the counter are listed in column I. For example, the counter score zero in column I corresponds to the zero pulse of the signal Fi, the counter score 1 corresponds to pulse 11 of the signal Fi, the counter score 2 to pulse 9 of the signal Fi, etc.

Column II shows which of the delayed signals d1 to d6 is to be chosen for each of the counter scores shown in column I. Column III shows the distances in time, expressed in period times of the signal Fi, at which the respective rising or falling edges of the signal Fo corresponding to the counter scores shown in column I arise. It is apparent now that there is a constant, invariable time lapse of 2 1/6 period of the signal Fi between every two consecutive rising edges of the signal Fo. In other words, the period time of the signal Fo is exactly equal to 13/6 of the period time of the signal Fi, not only on average, but also from any one pulse to the next.

A division of the frequency by 13/6 is discussed above with reference to FIGS. 2 and 3 exclusively by way of example. It is obviously possible to those skilled in the art to generate a similar relationship for any other ratio between Fo and Fi.

A circuit with which the above can be realized is shown in FIG. 4. FIG. 4 shows a signal source 1 which generates an output signal Fi and is connected to a clock input of a counter 2 and an input 3 of a delay locked loop 4. An output of the counter 2 is connected to an input of a decoder circuit 6 via a connection 5. The output of the decoder circuit 6 comprises a number of separate outputs which are connected to data inputs of a same number of data flipflops which have been given the general reference numbers 7 and 8. The clock inputs of the data flipflops 7 and 8 are connected to the output of the signal generator 1. The delay locked loop 4 comprises a number of delay elements a, b, c, . . . , R-2, R-1, and R. A feedback of the last signal from the delay element R to a control circuit 9 ensures that the delays of the delay elements remain in phase with the input signal Fi. The outputs of the delay elements a, b, c, . . . are connected to the clock inputs of data flipflops 10, 11, 12, . . . The data inputs of the flipflops 10, 11, 12, . . . are connected to the outputs of the first, the second, the third, . . . data flipflop of the flipflops 7 and 8. The outputs of the data flipflops 10, 11, 12, . . . are connected to the inputs of an OR circuit 13. The signal Fo appears at the output of the OR circuit 13.

The operation of the circuit shown in FIG. 4 is as follows, the following description being related to the 13/6 divider discussed with reference to FIGS. 2 and 3.

The output signal Fi of the signal generator 1 is supplied to the input 3 of the delay locked loop, which in this case comprises six delay elements a, b, c, R-2, R-1, and R. The counter 2 counts the individual pulses of the signal Fi. After a first pulse, i.e. no. 0, of the signal Fi, a signal appears at the connection line 5 which represents the number zero. After the second pulse 1 of the signal Fi, a signal representing the number 6 appears on the line 5. After the third pulse 2 of the signal Fi, a signal representing the number 12 appears on the line 5. After the fourth pulse 3, a signal representing the number 5 appears on the line 5. This continues with the subsequent pulses of the signal Fi, the line 5 having consecutive signals which represent the numbers 11, 4, 10, 3, 9, 2, 8, 1, 7, and then 0 again.

It is known from the Table of FIG. 3 that, if a signal representing the number 0 appears on the connection line 5, a rising edge of the once delayed signal Fi will lead to the rising edge of pulse zero of the signal Fo.

Each of the delay elements a, b, c, R-2, R-1, and R delays the signal Fi by 1/6, 2/6, 3/6, 4/6, 5/6, and 6/6, respectively, of one period of the signal Fi. This means that the signal d1 (see FIG. 2) appears at the output of delay line a, the signal d2 and the output of delay line b, the signal d3 at the output of delay line c, the signal d4 at the output of delay line R-2, the signal d5 at the output of delay line R-1, and the signal d6 at the output of delay line R.

The outputs of the decoder circuit 6 are zero, unless there is a one signal at one specific output of the decoder circuit, i.e. at one data input of the multiple data flipflop 7, owing to decoding of the signal on the connection line 5.

In the present case, in which the counter score zero is communicated by the signal on the connection line 5, the decoder circuit 6 is constructed such that the first output 6a is one. The fact that the output 6a is one has the result that the output 7a becomes one at the next pulse of the signal Fi at the clock input of the multiple data flipflop 7. This one signal is put in into a data flipflop 10 which is clocked by the output signal of the delay element a with a delay of 1/6 of one period of the input signal Fi, so that the one signal on the line 7a is passed on to. the output of the data flipflop 10 on line 10a.

In the same manner, the counter 2 will assume the counter score six upon the next pulse of the signal Fi. As a result, a signal arises on the connection line 5 which corresponds to the counter score 6 and, as is apparent from the Table of FIG. 3, the connection line 6a is switched to zero now by the decoder circuit 6, so that the output signal on the line 7a will become zero when the next clock pulse reaches the multiple data flipflop 7. Then, at the next, once delayed pulse of the delay line a supplied to the clock input of the data flipflop 10, the output signal of the data flipflop 10 on the line 10a will become equal to the signal on the line 7a, i.e. equal to zero. The first pulse of the signal Fo has been formed thereby. The rising edge of this first pulse has a delay of 1/6 of one period of the signal Fi as compared with the rising edge of pulse no. zero of the signal Fi. The duration of this first pulse, between the rising edge and the falling edge of this pulse no. zero of the signal Fo, is also equal to the period time of the input signal Fi. A signal representing the number 12 will appear on the connection line 5 at the output of the counter 2 upon the next pulse 2 of the signal Fi. As is apparent from the Table of FIG. 3, the decoder circuit 6 should now ensure that a twice delayed signal d2 leads to the generation of the second pulse 1 of the signal Fo. For this purpose, the decoder circuit 6 ensures that the signal on the line 6b becomes high in response to the signal which represents the number 12 on the connection line 5. In the same way as described above with reference to the signal on the connection line 6a becoming high and subsequently low again, the fact that the signal on the line 6b becomes high and subsequently low again ensures that the signal of the delay line b coming through flipflop 11 in conjunction with the signal on the output line 7b of the multiple flipflop 7 causes the second pulse 1 of the signal Fo to be formed on the line 11a. The signal being provided through the OR circuit 13 now comprises a first pulse no. 0 of the signal Fo with a delay of 1/6 with respect to the rising edge of the pulse no. 0 of the signal Fi, and a pulse no. 1 of the signal Fo with a rising edge having a delay of 2 2/6 periods of the signal Fi with respect to the rising edge of pulse no. 0 of the signal Fi.

It will now be obvious to those skilled in the art that the pulses 2, 3, 4, and 5 of the signal Fo will be formed at the output of the OR circuit 13 in the same manner.

The decoder circuit 6 achieves that the correct line 6a, 6b, 6c, 6d, 6e, or 6f is made one and subsequently zero again on the basis of the signals representing the numbers zero to twelve on the connection line 5. This is indicated in column IIa in FIG. 3. Column IIb shows whether the relevant line has a 1-signal or a 0-signal in response to the appearance of the number shown in column I on the connection line 5.

It will now be obvious to those skilled in the art in what way a fractional divider with a ratio P/Q can be realized for any two numbers P and Q. It suffices to construct the decoder circuit 6 on the basis of the Table shown in FIG. 3, which will not present any particular difficulties to those skilled in the art, as well as the counter 2. All other elements, such as the flipflops 7, 8, 10, 11 12, . . . , and the delay elements a, b, c . . . are elements known per se which are used in the normal manner.

Figure 5:
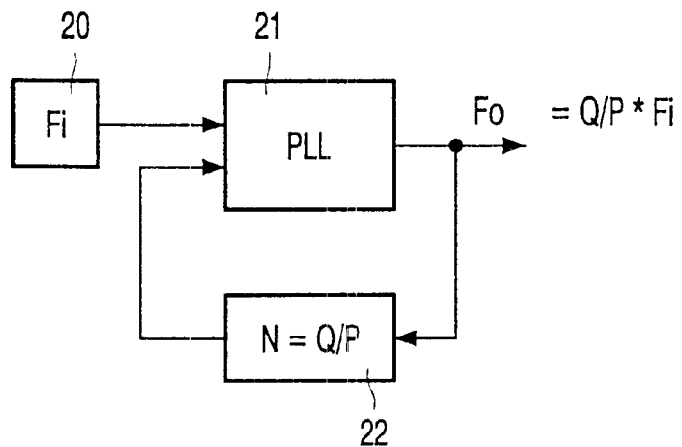
FIG. 5 shows a first application of a fractional N-divider.

FIG. 5 shows a PLL frequency synthesizer in which the fractional divider described above is used in the feedback loop. The circuit 5 shown in the Figure comprises a signal generator 20, a PLL circuit 21, and a divider 22. An output signal Fo of the PLL circuit 21 is connected to an input of the fractional divider 22, whose output in its turn is connected to an input of PLL 21.

The frequency step size in the output signal of a PLL synthesizer in which a divider 22 is used which divides the output frequency Fo by an integer number is equal to Fi. The frequency step size of the synthesizer with fractional division shown in FIG. 5, where the division N is equal to Q/P, is equal to Fi/P. Accordingly, the frequency resolution is P times greater. This means that the bandwidth of the loop can be chosen to be P times greater. The fact that the bandwidth can be chosen to be greater means that a faster tuning time can be achieved, in which less noise occurs (less jitter), a great catchment area, and a high resolution. The circuit can be implemented in a simple manner in integrated circuits and is inexpensive.

Figure 6:
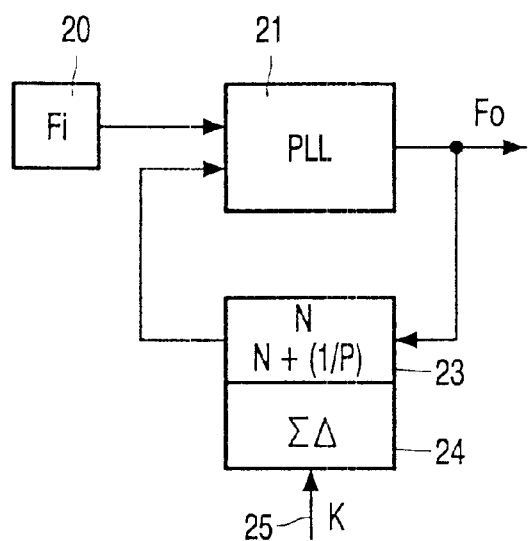
FIG. 6 shows a second application of a fractional N-divider.

FIG. 6 shows a second application of the fractional N-divider, again within a frequency synthesizer with phase locked loop. The basic circuit diagram of the circuit is shown in FIG. 6 and is known as a dithering synthesizer. Switching takes place between two dividends via the feedback block 23. The output frequency Fo will then be an average of the input frequency Fi divided by the two dividends. For example, if the first dividend is 4 and the other dividend is 5, Fo will switch between four times Fi and five times Fi, so that on average Fo will be equal to a number between 4 and 5, for example 4.5, times Fi. The input signal K on line 25 determines what the average frequency will be via a first-order sigma-delta modulator 24. If N is an integer number, which case is known in standard technology, a choice may be made by means of the signal K on line 25 between a division by N and a division by N+1. In the present case, however, where a division takes place by means of a circuit as described with reference to FIGS. 2 to 4, one step in the dividend of element 23 will be equal to 1/P instead of equal to 1. Switching will accordingly take place between a dividend N and a dividend N+(1/P). In other words, it will be possible to dither between Q/P and Q+1/P. Accordingly, the frequency resolution, which was equal to once Fi in the standard technology described above, will now be equal to (1/P)*Fi.

A plurality of embodiments and modifications of the circuits as described and depicted will now be obvious to those skilled in the art in view of the above.

What is claimed is:

1. A device for generating a second signal (Fo) having a frequency equal to a frequency of a first signal (Fi) divided by a rational, non-integer number, which rational number is greater than one and, when written as a fraction, can only be written with a denominator not equal to one, characterized by means for supplying the first signal (Fi) to a first (a) of a number of delay elements (a, b, . . . , R) connected in series for the purpose of further delaying the first signal (Fi) per delay element each time by a time period equal to a period time of the first signal (Fi) divided by the denominator of the fraction of the rational number, and by a combinatorial circuit which comprises a counter (2) for counting pulses of the first signal (Fi), which counting takes place via a counting modulo of the rational number and in increments of the denominator of the rational number and results in counter scores which combinatorial circuit (6, 7, 9, 10, 11, 12, 13) comprises a decoder circuit (6) for decoding counter scores on the basis of an algorithm determined by the rational number, said decoded counter scores appearing as an output signal each time at one output (6a, . . . , 6e), determined by the counter score and the algorithm, of the decoder circuit (6), and which combinatorial circuit (6, 7, 8, 10, 11, 12, 13) comprises means (7, 8, 10, 11, 12, 13) for combining output signals of the number of delay elements determined by the algorithm with output signals of the decoder circuit so as to obtain the second signal (Fo).

2. A device as claimed in claim 1 or 2, characterized in that the number of delay elements (a, b, . . . , R) is equal to the denominator of the rational number.

3. A device as claimed in claim 1, characterized in that the number of outputs (6a, . . . , 6e) of the decoder circuit is equal to the denominator of the rational number.

4. A device as claimed in claim 1, characterized in that the delay elements (a, b, . . . , R) are connected as a delay locked loop circuit.

5. A phase locked loop circuit comprising a feedback: loop, characterized in that a device as claimed in claim 1 is included in said feedback loop.

6. A phase locked loop circuit comprising a feedback loop with a dithering possibility, characterized in that a device as claimed in claim 1 is included in said feedback loop.

* * * * *